United States Patent
Park et al.

(10) Patent No.: US 9,270,232 B2
(45) Date of Patent: Feb. 23, 2016

(54) AMPLIFIER APPARATUS AND METHODS USING VARIABLE CAPACITANCE DEPENDENT ON FEEDBACK GAIN

(75) Inventors: Yu Jin Park, Seoul (KR); Soon Hwa Kang, Hwaseong-si (KR); Min Ho Kwon, Seoul (KR); Jae Hong Kim, Suwon-si (KR); Kwi Sung Yoo, Seoul (KR); Seung Hyun Lim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 346 days.

(21) Appl. No.: 13/618,156

(22) Filed: Sep. 14, 2012

(65) Prior Publication Data

US 2013/0135503 A1    May 30, 2013

(30) Foreign Application Priority Data

Nov. 29, 2011   (KR) .......................... 10-2011-0126262

(51) Int. Cl.
| | |
|---|---|
| H04N 5/335 | (2011.01) |
| H03F 1/34 | (2006.01) |
| H03F 1/08 | (2006.01) |
| H03F 3/45 | (2006.01) |
| G11C 27/02 | (2006.01) |

(52) U.S. Cl.
CPC ................ *H03F 1/34* (2013.01); *G11C 27/026* (2013.01); *H03F 1/086* (2013.01); *H03F 3/45188* (2013.01); *H03F 2200/153* (2013.01); *H03F 2203/45512* (2013.01); *H03F 2203/45514* (2013.01)

(58) Field of Classification Search
CPC .......................... H04N 5/3745; H04N 5/37457
USPC ........................................................... 348/308
See application file for complete search history.

(56) References Cited

U.S. PATENT DOCUMENTS

| | | | |
|---|---|---|---|
| 6,693,488 B1 | 2/2004 | Van Rhijn | |
| 7,834,611 B2 | 11/2010 | Kim et al. | |
| 2001/0008422 A1* | 7/2001 | Mizuno et al. | 348/302 |
| 2002/0012058 A1* | 1/2002 | Mizuno | 348/308 |
| 2005/0189995 A1* | 9/2005 | Kee et al. | 330/295 |
| 2009/0190018 A1* | 7/2009 | Sakakibara | 348/308 |
| 2010/0289466 A1 | 11/2010 | Telefus | |
| 2012/0287077 A1* | 11/2012 | Pant et al. | 345/174 |

* cited by examiner

*Primary Examiner* — Usman Khan
(74) *Attorney, Agent, or Firm* — Myers Bigel & Sibley, P.A.

(57) ABSTRACT

An apparatus includes an operational amplifier circuit comprising at least one operational amplifier and a feedback circuit coupled between the output terminal and input terminal of the operational amplifier circuit and configured to apply a feedback gain to an output signal at the output of the first operational amplifier. The apparatus further includes a variable compensation capacitor coupled to the output terminal of the operational amplifier circuit and configured to vary a capacitance thereof responsive to the feedback gain.

15 Claims, 13 Drawing Sheets

AMPLIFIER APPARATUS AND METHODS USING VARIABLE CAPACITANCE DEPENDENT ON FEEDBACK GAIN

CROSS-REFERENCE TO RELATED APPLICATIONS

This application claims priority under 35 U.S.C. §119(a) from Korean Patent Application No. 10-2011-0126262 filed on Nov. 29, 2011, the disclosure of which is hereby incorporated by reference in its entirety.

BACKGROUND

Embodiments of the inventive subject matter relate to image signal processing circuits and electronic devices incorporating the same and, more particularly, to operational amplifier circuits used to process image signals from, for example, a pixel sensor array.

An image sensor is a device that captures an image using a semiconductor reaction to light. Recently, with the development of complementary metal oxide semiconductor (CMOS) technology, CMOS image sensors are being widely used. Some conventional CMOS image sensors use correlated double sampling (CDS) and output a signal resulting from the CDS, e.g., a difference between a reset signal and an image signal, in a digital format.

A CMOS image sensor circuit may include a programmable gain amplifier (PGA), an analog-to-digital converter (ADC circuit), and a sense amplifier (SA). The PGA, the ADC circuit, and the SA typically include operational amplifier circuits. The ADC circuit may include a sample-and-hold amplifier (SHA) and a digital-to-analog converter (DAC). The SHA and the DAC may also include operational amplifier circuits.

Such operational amplifier circuits may include a negative feedback amplifier. The gain of a negative feedback amplifier generally depends on circuit components forming the operational amplifier circuit. When the gain of the negative feedback amplifier approaches infinity, the output of the operational amplifier circuit may oscillate.

The stability of the operational amplifier circuit is generally influenced by phase margin (PM). FIGS. 1A and 1B are Bode plots of frequency response of a conventional operational amplifier circuit. Referring to FIGS. 1A and 1B, frequencies at which feedback loop gain and phase are 1 and −180 degrees, respectively, are important to the stability of the operational amplifier circuit. The frequency at which the feedback loop gain is 1 is referred to as a gain crossover. The frequency at which the feedback loop phase is −180 degrees is referred to as a phase crossover.

It is desirable that the gain crossover be less than the phase crossover in order to provide stable operation of the operational amplifier circuit. Stability can be improved by shifting the phase crossover away from the origin or shifting the gain crossover toward the origin. The stability of a system can be measured in terms of PM. The PM is defined as PM=180°+ $\angle \beta H(\omega=\omega 1)$, where $\omega 1$ is the gain crossover frequency.

When the gain crossover is shifted toward the origin, the stability of the operational amplifier circuit is increased, but the bandwidth is generally decreased. As a result, high-frequency signals are attenuated. When the bandwidth is increased, the operational amplifier circuit can realize higher speed. When an operational amplifier circuit that can realize a wide bandwidth is used, high sampling speed may be achieved in communications and image processing applications, such as in mobile communication equipment, asynchronous digital subscriber loop (ADSL), digital camcorders, and high-definition television (HDTV) and imaging systems.

SUMMARY

According to some embodiments of the inventive subject matter, an apparatus includes an operational amplifier circuit including at least one operational amplifier and a feedback circuit coupled between an output terminal and an input terminal of the operational amplifier circuit and configured to apply a feedback gain to an output signal at the output terminal of the operational amplifier circuit. The apparatus further includes a variable compensation capacitor coupled to the output terminal of the operational amplifier circuit and configured to vary a capacitance thereof responsive to the feedback gain.

In some embodiments, the variable compensation capacitor may be coupled in parallel with a load capacitance at the output terminal of the operational amplifier circuit. In some embodiments, the operational amplifier circuit may include first and second operational amplifiers coupled in cascade, the feedback circuit may be coupled between an output terminal of the second operational amplifier and an input of the first operational amplifier, and the variable compensation capacitor may be coupled between the output terminal of the second operational amplifier and an input terminal of the second operational amplifier.

In some embodiments, the capacitance of the variable compensation capacitor may be increased when the feedback gain is 1. In further embodiments, the capacitance of the variable compensation capacitor may be decreased when the feedback gain is less than 1.

In additional embodiments, the apparatus may further include a series combination of a capacitor and a switch coupled in parallel with the variable compensation capacitor.

Additional embodiments provide a correlated double sampling (CDS) integrator circuit including the apparatus. The integrator circuit may include a first capacitor configured to be charged with the input signal and to transfer a charge, a second capacitor connected between the first capacitor and the input terminal of the operational amplifier circuit and a third capacitor coupled to the output terminal of the operational amplifier circuit. The integrator circuit may also include a switching circuit coupled to the first, second and third capacitors and configured to charge the first capacitor and the third capacitor with charges corresponding to image and reset samples and to charge the second capacitor with a charge corresponding to an input offset voltage of the operational amplifier circuit such that a signal at the output terminal of the operational amplifier circuit represents a difference between the image and reset samples. The switching circuit may include a switch configured to short the third capacitor responsive to a reset signal and the variable compensation capacitor may increase in capacitance when the reset signal is active.

Further embodiments provide an image sensor circuit including an analog processor circuit including the integrator circuit and configured to sample and amplify an input analog signal and an analog-to-digital converter circuit configured to convert an analog signal output from the analog processor circuit into a digital signal. Still further embodiments provide electronic devices and systems including the image sensor circuit.

Some embodiments of the inventive subject matter provide methods including varying a capacitance coupled to the output terminal of an operational amplifier circuit including at least one operational amplifier responsive to a feedback gain of the operational amplifier circuit. Varying a capacitance coupled to the output terminal of an operational amplifier circuit including at least one operational amplifier responsive to a feedback gain of the operational amplifier circuit may include increasing the capacitance when the feedback gain has a value of 1. Varying a capacitance coupled to the output terminal of an operational amplifier circuit including at least one operational amplifier responsive to a feedback gain of the operational amplifier circuit may include decreasing the capacitance when the feedback gain has a value less than 1.

Further embodiments provide an apparatus including a differential amplifier circuit, a common-gate amplifier circuit coupled to an output terminal of the differential amplifier circuit, and a feedback circuit coupled between an output terminal of the common-gate amplifier and an input terminal of the differential operational amplifier circuit and configured to apply a feedback gain to an output signal at the output terminal of the common-gate amplifier circuit. The apparatus further includes a variable compensation capacitor coupled to the output terminal of the common gate amplifier circuit and configured to vary a capacitance thereof responsive to the feedback gain.

In some embodiments, the variable compensation capacitor may be coupled between an output terminal of the differential amplifier circuit and the output terminal of the common-gate amplifier circuit. In some embodiments, the variable compensation capacitor may be coupled in parallel with a load capacitance at the output of the common-gate amplifier circuit. The apparatus may further include a series combination of another capacitor and a switch coupled in parallel with the variable compensation capacitance.

BRIEF DESCRIPTION OF THE DRAWINGS

The above and other features and advantages of the inventive subject matter will become more apparent by describing in detail exemplary embodiments thereof with reference to the attached drawings in which.

DETAILED DESCRIPTION

Figure 1A:
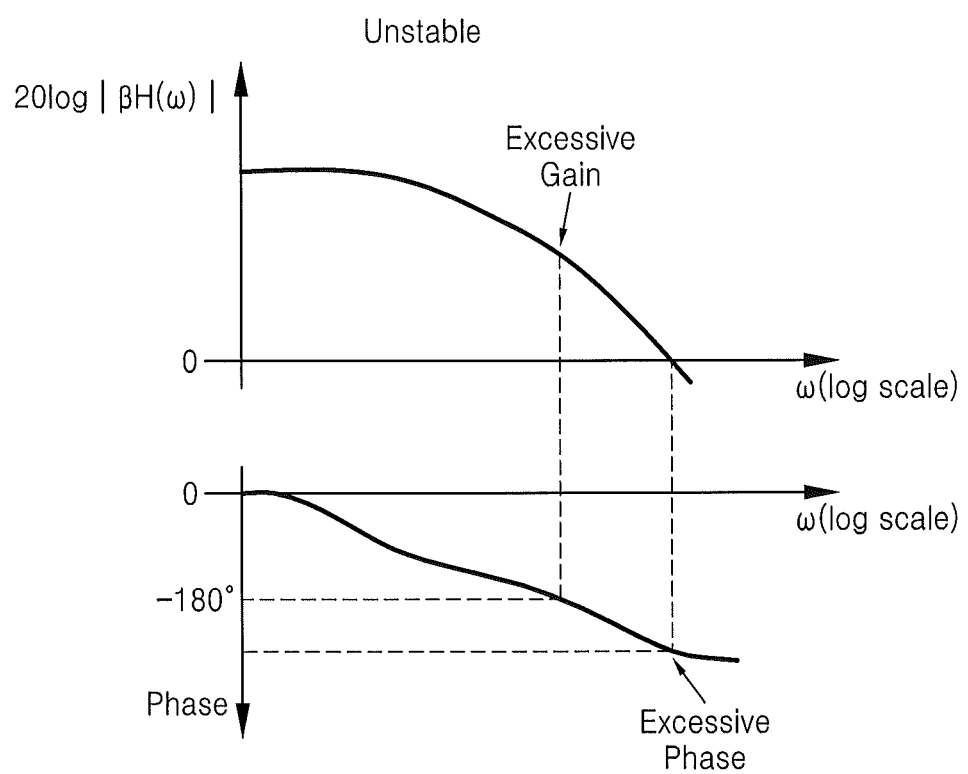
FIGS. 1A and 1B are Bode plots showing the magnitude and the phase of the frequency response of a conventional operational amplifier circuit.
Figure 1B:
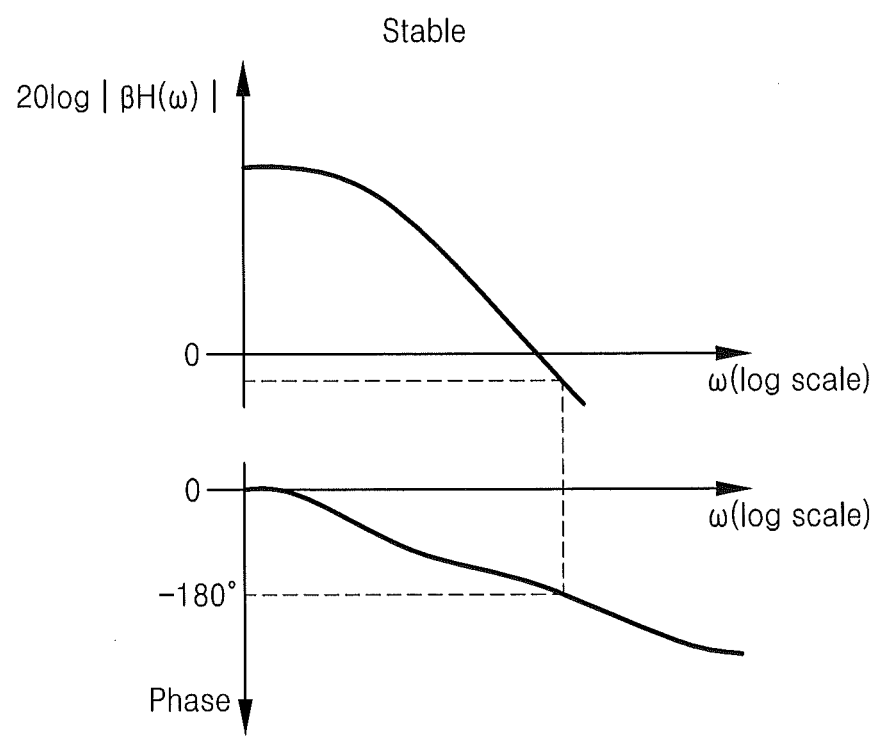

The inventive subject matter now will be described more fully hereinafter with reference to the accompanying drawings, in which embodiments of the invention are shown. This inventive subject matter may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like components throughout.

It will be understood that when a component is referred to as being "connected" or "coupled" to another component, it can be directly connected or coupled to the other component or intervening components may be present. In contrast, when a component is referred to as being "directly connected" or "directly coupled" to another component, there are no intervening components present. As used herein, the term "and/or" includes any and all combinations of one or more of the associated listed items and may be abbreviated as "/".

It will be understood that, although the terms first, second, etc. may be used herein to describe various components, these components should not be limited by these terms. These terms are only used to distinguish one component from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, components, and/or components, but do not preclude the presence or addition of one or more other features, regions, integers, steps, operations, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 2:
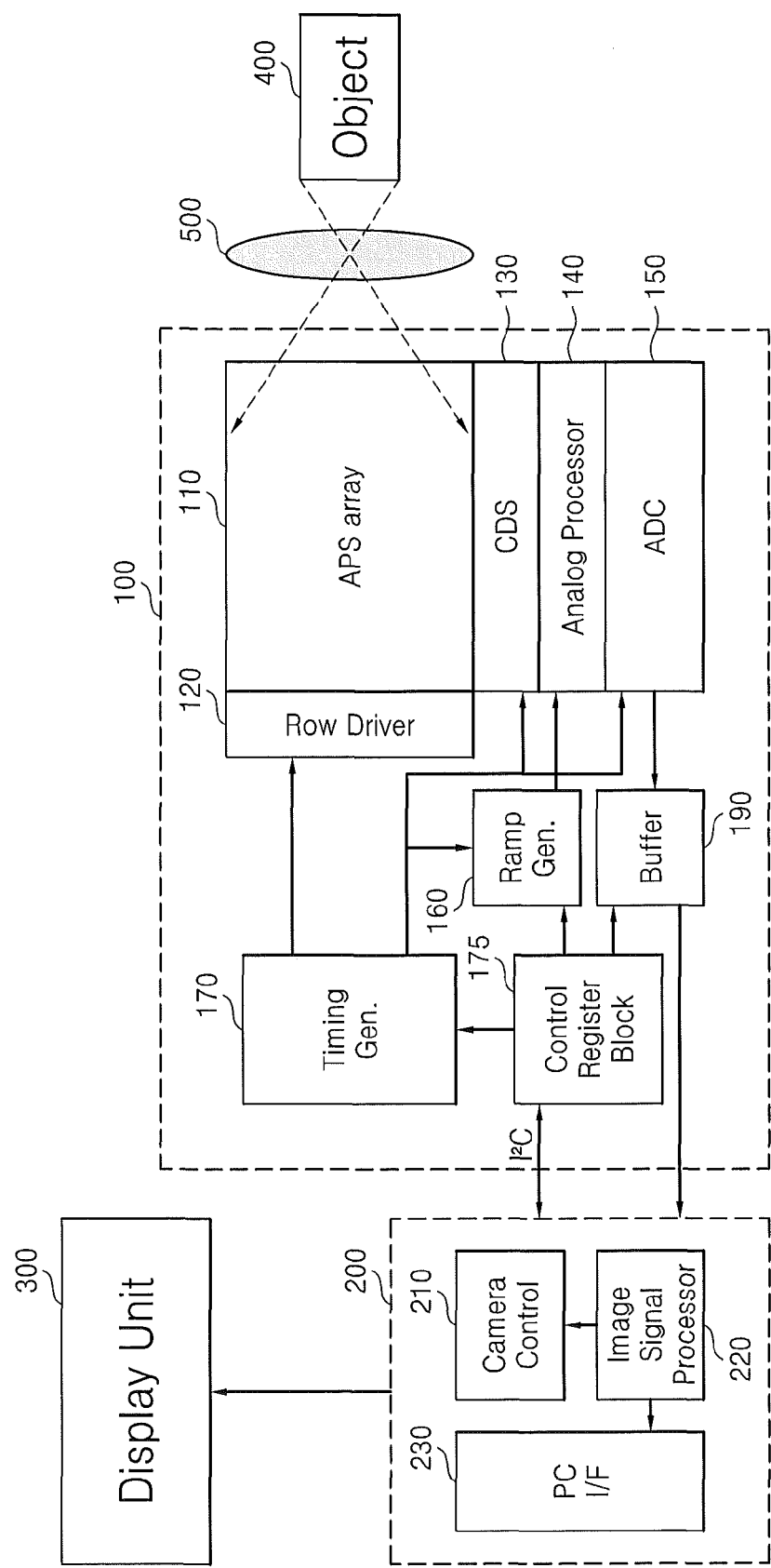
FIG. 2 is a schematic diagram illustrating an electronic device according to some embodiments of the inventive subject matter.

FIG. 2 is a schematic diagram illustrating an image sensor circuit 100 according to some embodiments of the inventive subject matter. Referring to FIG. 2, the image sensor circuit 100 includes a pixel array (e.g., an active pixel sensor (APS) array) 110, a row driver circuit 120, a correlated double sampling (CDS) circuit 130, an analog processor circuit 140, an analog-to-digital converter (ADC) circuit 150, a ramp generator circuit 160, a timing generator circuit 170, a control register circuit 175, and a buffer circuit 190.

The image sensor circuit 100 is controlled by a digital signal processor circuit (DSP circuit) circuit 200 to sense an object 400 photographed through a lens 500. The DSP circuit 200 outputs the image sensed by the image sensor circuit 100 to a display unit 300. The display unit 300 may be any electronic device that can output images. For instance, the display unit 300 may be a display of a computer, a portable phone, or an image output terminal.

The DSP circuit 200 includes a camera control circuit 210, an image signal processor circuit 220, and a personal computer (PC) interface (I/F) circuit 230. The camera control circuit 210 controls the control register circuit 175. The camera control circuit 210 may control the image sensor circuit 100, and more specifically, the control register circuit 175 using an inter-integrated circuit ($I^2C$) interface, but the scope of the inventive subject matter is not restricted thereto.

The image signal processor circuit 220 receives image data, i.e., an output signal of the buffer circuit 190, processes the image data into an image nice for people to look at, and outputs the image to the display unit 300 through PC I/F circuit 230.

The image signal processor circuit 220 is implemented using the DSP circuit 200 in the embodiments illustrated in FIG. 2, but other embodiments may use different circuit implementations. For instance, the image signal processor circuit 220 may be implemented using the image sensor circuit 100.

The pixel array 110 includes a plurality of photosensitive devices, such as photo diodes or pinned photo diodes. The pixel array 110 senses light using the photosensitive devices and converts the light into electrical image signals.

The timing generator circuit 170 may output a control signal to the row driver circuit 120, the ADC circuit 150, and the ramp generator circuit 160 to control the operations of the row driver circuit 120, the ADC circuit 150, and the ramp generator circuit 160. The control register circuit 175 may output a control signal to the ramp generator circuit 160, the timing generator circuit 170, and the buffer circuit 190 to control the operations of these circuits. The control register circuit 175 is controlled by the camera control circuit 210.

The row driver circuit 120 drives the pixel array 110 in units of rows. For instance, the row driver circuit 120 may generate a row selection signal. The pixel array 110 outputs to the CDS circuit 130 a reset signal and an image signal from a row selected by the row selection signal received from the row driver circuit 120. The CDS circuit 130 may perform CDS on the reset signal and the image signal.

The ADC circuit 140 may include a programmable gain amplifier (PGA) circuit (e.g., PGA circuit 142 in FIG. 3) for color balancing. The PGA circuit may amplify a sampled signal received from the CDS circuit 130 with a predetermined gain. The PGA circuit may also adjust its output so that a signal digitized by the ADC circuit 150 has a maximum dynamic range.

The ADC circuit 150 compares a ramp signal output from the ramp generator circuit 160 with a CDS signal output from the CDS circuit 130, generates a comparison signal, generate a count responsive to the comparison signal, and outputs a count result to the buffer circuit 190.

The buffer circuit 190 temporarily stores a digital signal output from the ADC circuit 150 and senses and amplifies the digital signal before outputting it. The buffer circuit 190 may include a plurality of column memory circuits, e.g., static random access memories (SRAMs), which are provided for respective columns for temporary storage; and a sense amplifier (SA) circuit that senses and amplifies the digital signal received from the ADC circuit 150.

Figure 3:
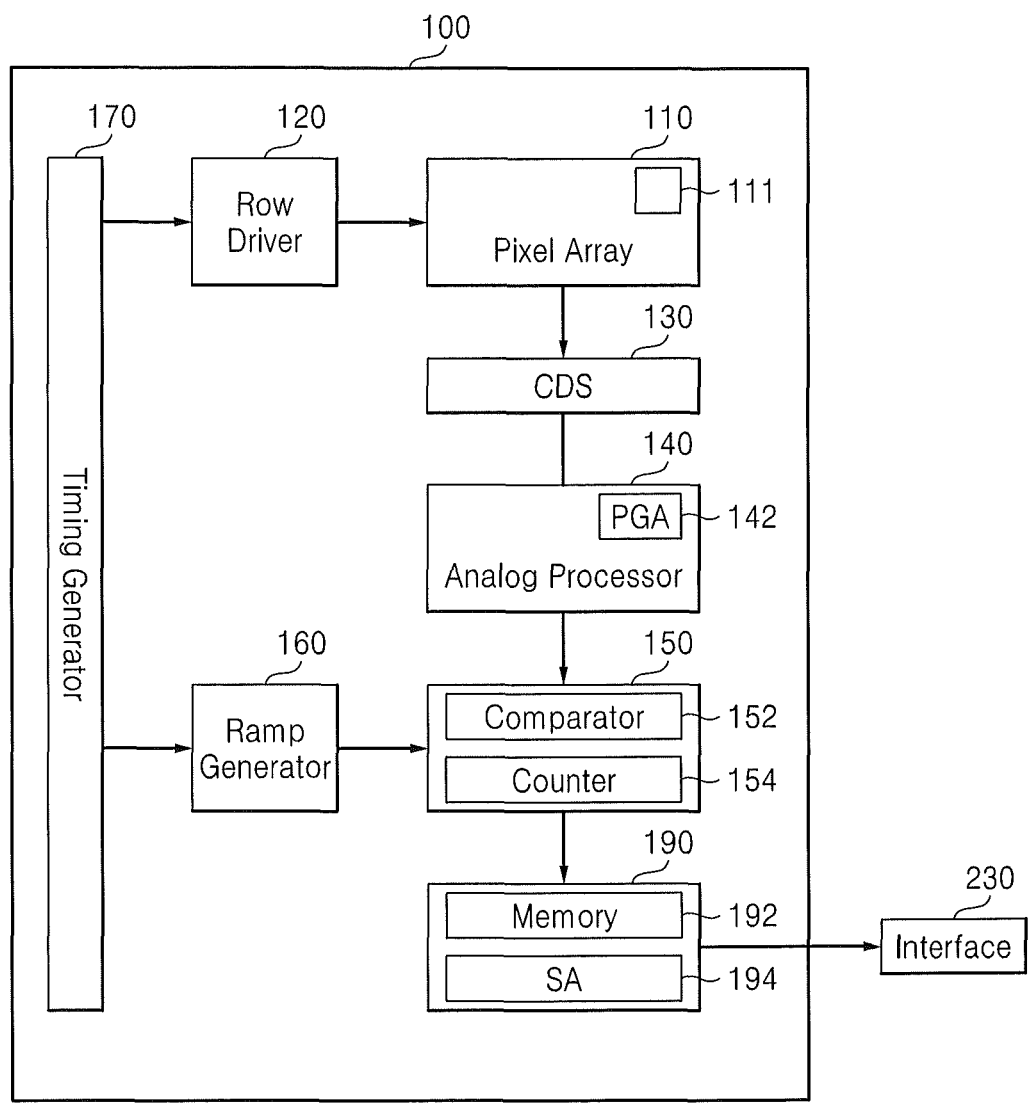
FIG. 3 is a detailed diagram of an image sensor circuit of the electronic device of FIG. 2 according to some embodiments.

FIG. 3 is a detailed diagram of the image sensor circuit 100 illustrated in FIG. 2. Referring to FIG. 3, the image sensor circuit 100 includes the pixel array 110, the row driver circuit 120, the CDS circuit 130, the analog processor circuit 140, the ADC circuit 150, the ramp generator circuit 160, the timing generator circuit 170, and the buffer circuit 190. The analog processor circuit 140 may include the PGA circuit 142. The ADC circuit 150 includes a comparator 152 and a counter 154.

The pixel array 110 may include a plurality of pixels 111 arranged in a matrix form, each of which is connected to one of a plurality of row lines and one of a plurality of column lines.

The pixels 111 may include a red pixel that converts light in the red spectrum into an electrical signal, a green pixel that converts light in the green spectrum into an electrical signal, and a blue pixel that converts light in the blue spectrum into an electrical signal. Color filters may be arrayed above each of the pixels 111 to transmit light in a particular spectrum.

Each pixel 111 may output a pixel signal (e.g., a reset signal and an image signal) to a column in response to a plurality of control signals generated by the row driver circuit.

An image signal may be viewed as a signal that is generated in proportion to photogenerated charge in a signal output from the pixel 111. The reset signal is a signal that is output from the pixel 111 when a floating diffusion node in the pixel 111 is reset to a high power supply voltage.

The row driver circuit 120 may decode a row control signal (e.g., an address signal) generated by the timing generator circuit 170 and select at least one row line from among the row lines included in the pixel array 110 in response to the decoded row control signal.

The CDS circuit 130 may perform CDS on the pixel signal output from a pixel 111 connected to one of the column lines included in the pixel array 110. When the CDS is performed, fixed pattern noise occurring in an electrical signal is removed. The fixe pattern noise is a disadvantage of a CMOS image sensor circuit as compared to a charge-coupled device (CCD) image sensor circuit. When the CDS circuit 130 performs the CDS, multiple types of samples may be obtained, including a reset signal sample and an image signal sample output to a read-out node. The CDS circuit 130 may output a signal representing a difference between these two types of samples.

In detail, the CDS circuit 130 may sample an output from the pixel array 110 during a reset phase and may sample an image signal output from the pixel array 110 during an imaging phase. The CDS circuit 130 may integrate a difference between the reset sample and the image sample and output an integration signal.

Referring still to FIG. 3, the analog processor circuit 140 may include a PGA circuit 142 for color balancing. The PGA circuit 142 may amplify the signal sampled by the CDS circuit 130. The PGA circuit 142 may adjust its gain so that a signal digitized in the ADC circuit 150 has a maximum dynamic range. The pixels 111 may be connected to respective PGA circuits 142. For instance, a PGA circuit 142 may amplify a signal from a green pixel 111 with a unit gain, another PGA circuit 142 may amplify a signal from a red pixel 111 with a gain of 0.8 through 1.2, and another PGA circuit 142 may amplify a signal from a blue pixel 111 with a gain of 2.5 through 3.0. The gain of each PGA circuit 142 may be preset. Alternatively, a single PGA circuit 142 may be used for all of the pixels 111.

Figure 4:
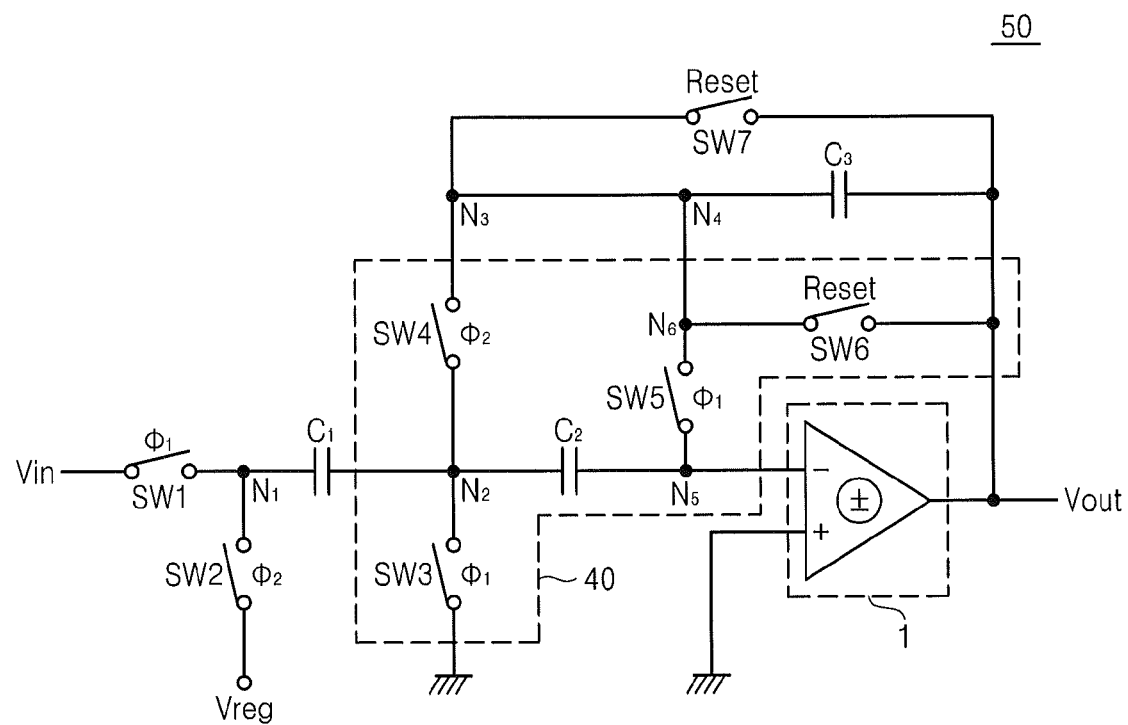
FIG. 4 is a circuit diagram of an integrator circuit of an analog-to-digital converter (ADC circuit) circuit according to some embodiments of the inventive subject matter.

The PGA circuit 142 may include an operational amplifier circuit. An example of such an operational amplifier circuit 1 is shown in FIG. 4. The operational amplifier circuit 1 includes a feedback circuit and has a feedback gain β. The feedback gain β affects the bandwidth and the setting time of a closed loop. When the feedback gain β increases, the bandwidth of the amplifier circuit increases and output signal settling time is shortened, but stability decreases. The settling time is time taken for a signal make a transition from a logic low to a logic high.

In some embodiments, the analog processor circuit 140 may include the CDS circuit 130 and perform both the CDS operations and the operations of the PGA circuit 142 in order to reduce the area of the image sensor circuit 100.

Referring again to FIG. 3, the ADC circuit 150 includes a plurality of comparators 152 and each comparator 152 is connected to the CDS circuit 130 and the ramp generator circuit 160. The CDS circuit 130 may be connected with a first input terminal of the comparator 152 and the ramp generator circuit 160 may be connected to a second input terminal of the comparator 152.

The ADC circuit 150 may be a delta-sigma ADC circuit. The delta-sigma ADC circuit may include a delta-sigma modulator and a digital filter.

The comparator 152 may compare an output signal of the CDS circuit 130 and/or the analog processor circuit 140 with a ramp signal received from the ramp generator circuit 160 and output a comparison result signal to an output terminal. The comparison result signal output from the comparator 152 may correspond to a difference between a reset signal and an image signal varying with the luminance of external light. To output the difference between the image signal and the reset signal, the ramp signal is used, so that the difference between the image signal and the reset signal is generated according to the slope of the ramp signal. The ramp generator circuit 160 may operate based on a control signal generated by the timing generator circuit 170.

The ADC circuit 150 also includes a plurality of counters 154. The counters 154 are connected to output terminals of the respective comparators 152. The ADC circuit 150 generates a count responsive to the comparison result signal based on a clock signal CNT_CLK received from the timing generator circuit 170 and outputs a digital signal as a count result. The clock signal CNT_CLK may be generated by a counter controller of the counters 154 or by the timing generator circuit 170 based on a counter control signal generated by the timing generator circuit 170.

The counters 154 may include an up/down counter and a bit-wise inversion counter. The bit-wise inversion counter may carry out a similar operation to the up/down counter. For instance, the bit-wise inversion counter may perform only counting up and a function of inverting all bits to make them into 1's complements. Therefore, the bit-wise inversion counter may perform reset counting and invert a result of the reset counting, so that the result is converted into 1's complement, i.e., a negative value.

The buffer circuit 190 includes a plurality of memories 192 and a SA 194. Each memory 192 may operate in response to a memory control signal generated by a memory controller (not shown) positioned within the memory 192 or the timing generator circuit 170 based on a control signal generated by the timing generator circuit 170. The memory 192 may be an SRAM.

In response to the memory control signal, the memories 192 temporarily store a digital signal output from the counters 151 and then output it to the SA 194. The SA 194 senses and amplifies the digital signal before outputting it.

An image is output to the display unit 300 through the PC I/F circuit 230.

Referring to FIG. 4, the analog processor circuit 140 of FIG. 3 may include an integrator circuit 50. The integrator circuit 50 may include the operational amplifier circuit 1, an offset correction circuit 40, a plurality of capacitors $C_1$, $C_2$, and $C_3$, and a plurality of switches SW1 through SW7.

A second input terminal, i.e., a positive (+) input terminal of the operational amplifier circuit 1 may be connected to a ground. A reference voltage may be applied to the second input terminal of the operational amplifier circuit 1.

An offset voltage may occur in the operational amplifier circuit 1 due to the operational characteristics. The offset correction circuit 40 may include the second capacitor $C_2$ for charging the operational amplifier circuit 1 with a charge corresponding to the offset voltage and a plurality of the switches SW3 through SW5. The second capacitor $C_2$ may be connected between a second node $N_2$ and a first input terminal, i.e., a negative (−) input terminal of the operational amplifier circuit 1.

In the integrator circuit 50, the operational amplifier circuit 1, the switches SW1 through SW5, and the first through third capacitors $C_1$ through $C_3$ may act as an integrator according to the switching operations of the first through fifth switches SW1 through SW5. The first switch SW1 may transmit a signal Vin output from the pixel array 110 to a first node $N_1$. The first capacitor $C_1$ may be connected between the first node $N_1$ and the second node $N_2$. The third switch SW3 may be connected to the second node $N_2$ to apply a reference voltage to the second node $N_2$. When the third switch SW3 is closed, the first capacitor $C_1$ connected between the first node $N_1$ and the second node $N_2$ may be charged with a charge corresponding to a difference between the signal Vin received from the pixel array 110 and the reference voltage. The reference voltage may be a DC voltage or a ground voltage.

In a reset period, the first, third and fifth switches SW1, SW3, and SW5 and the reset switches SW6 and SW7 are turned on in response to a signal $\Phi_1$ and a reset signal Reset. The first capacitor $C_1$ may be charged with a reset sample signal output from the pixel array 110, and the third capacitor $C_3$ may be discharged as the reset switches SW6 and SW7 are closed. In addition, the second capacitor $C_2$ may be charged with the offset voltage generated in the operational amplifier circuit 1. The offset voltage generated in the operational amplifier circuit 1 is compensated for using the offset voltage charged in the second capacitor $C_2$.

When the second and fourth switches SW2 and SW4 are turned on in response to a signal $\Phi_2$, the first capacitor $C_1$ may be charged with the reference voltage or may be discharged, and the third capacitor $C_3$ may be charged with charge stored in the first capacitor $C_1$.

At a subsequent clock transition, an image sample signal may charge the first capacitor $C_1$. The image charge stored in the first capacitor $C_1$ may be output to the third capacitor $C_3$. The third capacitor $C_3$ may be charged with charge corresponding to a difference between the reset sample and the image sample. According to switching control, a voltage corresponding to the charge representing the difference between the reset sample and the image sample may be amplified by a factor of two at the output. The amplification gain of the operational amplifier circuit 1 may be determined depending on a capacitance ratio between the first and third capacitors $C_1$ and $C_3$.

The first through third capacitors $C_1$ through $C_3$ may be switched capacitors, and therefore, the integrator circuit 50 included in the analog processor circuit 140 may be a switched-capacitor integrator.

Figure 5:
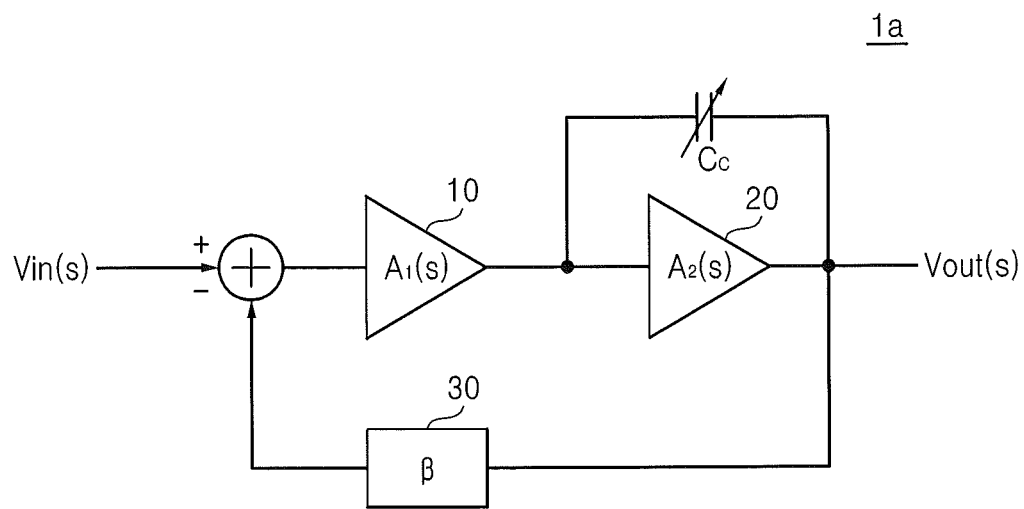
FIG. 5 is a schematic diagram conceptually illustrating an operational amplifier circuit according to some embodiments of the inventive subject matter.

FIG. 5 is a conceptual diagram of an exemplary implementation of the operational amplifier circuit 1 of FIG. 3 according to some embodiments of the inventive subject matter. Referring to FIG. 5, an operational amplifier circuit 1a may include a first operational amplifier 10 and a second operational amplifier 20 serving as first and second stages. The operational amplifier circuit 1a further includes a feedback circuit 30 and a variable compensation capacitor $C_C$. The first operational amplifier 10 may be a differential amplifier, and the second operational amplifier 20 may be a common source amplifier. The variable compensation capacitor $C_C$ is used to secure the stability of the operational amplifier circuit 1a that includes a negative feedback circuit as a frequency compensation circuit. The variable compensation capacitor $C_C$ has a variable capacitance.

The product of a voltage gain of the first operational amplifier 10 and a voltage gain of the second operational amplifier 20 is a voltage gain of the operational amplifier circuit 1a. When the frequency of an input signal Vin(s) is low, the voltage gain of the operational amplifier circuit 1a is relatively high.

The variable compensation capacitor $C_C$ may compensate the frequency to increase a phase margin of the operational amplifier circuit 1a, thereby stabilizing the operational amplifier circuit 1a. When the variable compensation capacitor $C_C$ is included in the operational amplifier circuit 1a, a lower-frequency pole of the amplifier circuit 1a shifts lower in frequency and a higher-frequency pole of the amplifier circuit 1a shifts higher in frequency, such that an increased pole split occurs. The increased pole split can provide a desirably large phase margin. The capacitance of the variable compensation capacitor $C_C$ changes with the feedback gain β.

The feedback circuit 30 may change an input of the first operational amplifier 10 using the feedback gain β. The phase margin is influenced by the feedback gain β. The feedback gain β is a value predetermined according to the internal structure of the operational amplifier circuit 1a. When the negative feedback circuit is formed using passive components, a maximum gain is 1 and the phase margin of the operational amplifier circuit 1a is minimum.

The maximum value of the feedback gain that the operational amplifier circuit 1a can have to maintain stability is 1. When a unity gain feedback circuit is used, the operational amplifier circuit 1a may be unstable.

The stability of a system may be measured by a phase margin (PM). The PM is defined as PM=180°+∠βH(ω=ω1) where ω1 is a gain crossover frequency. When stability is increased by decreasing the feedback gain β, the PM increases, but the gain crossover frequency decreases. When the gain crossover frequency decreases, the frequency of a signal that can be output by the operational amplifier circuit 1a also decreases.

However, when the variable compensation capacitor $C_C$ is included in the operational amplifier circuit 1a, both stability and gain crossover frequency are increased by changing the capacitance according to the feedback gain β. For instance, when the PM increase, that is, when the feedback gain β is less than 1, the operational amplifier circuit 1a increases the capacitance value of the variable compensation capacitor $C_C$, thereby adjusting the pole split. As a result, the gain crossover frequency is increased.

Figure 6A:
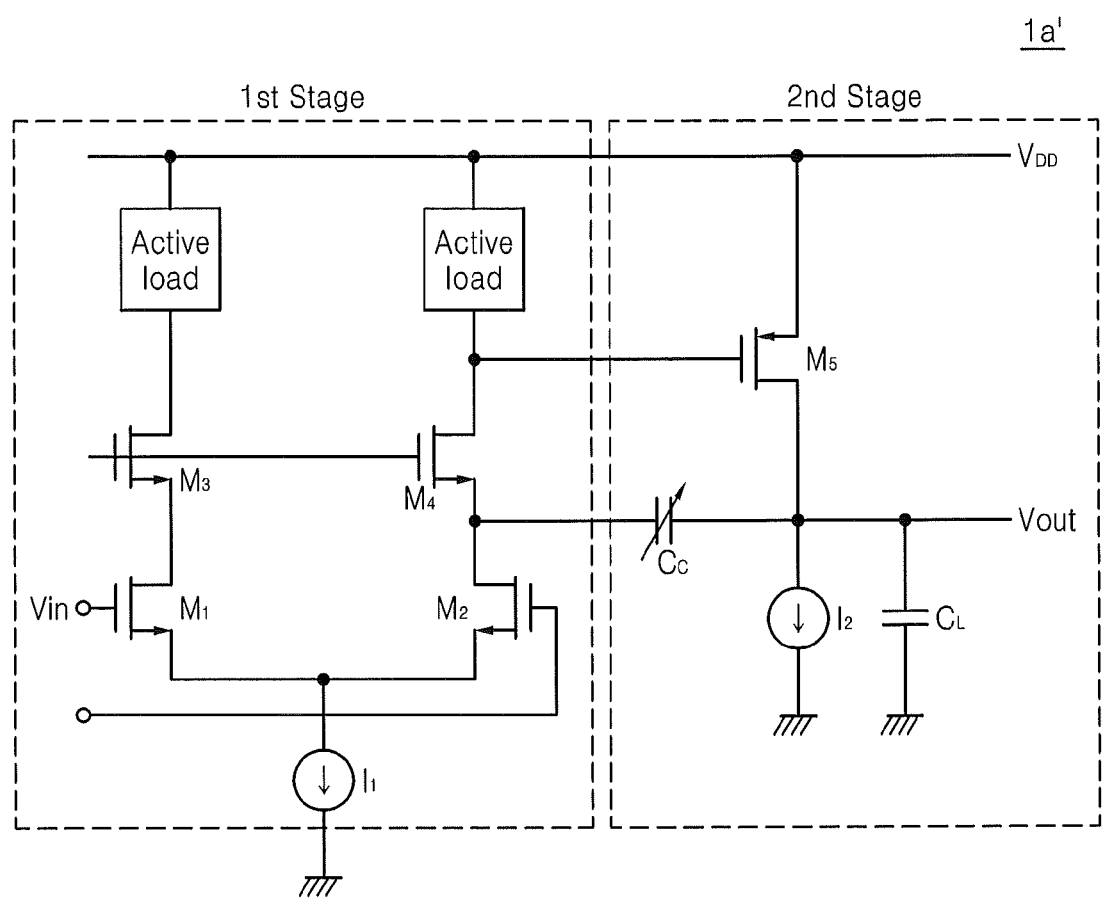
FIG. 6A is a circuit diagram of an implementation of operational amplifier circuit illustrated in FIG. 5 according to some embodiments.
Figure 6B:
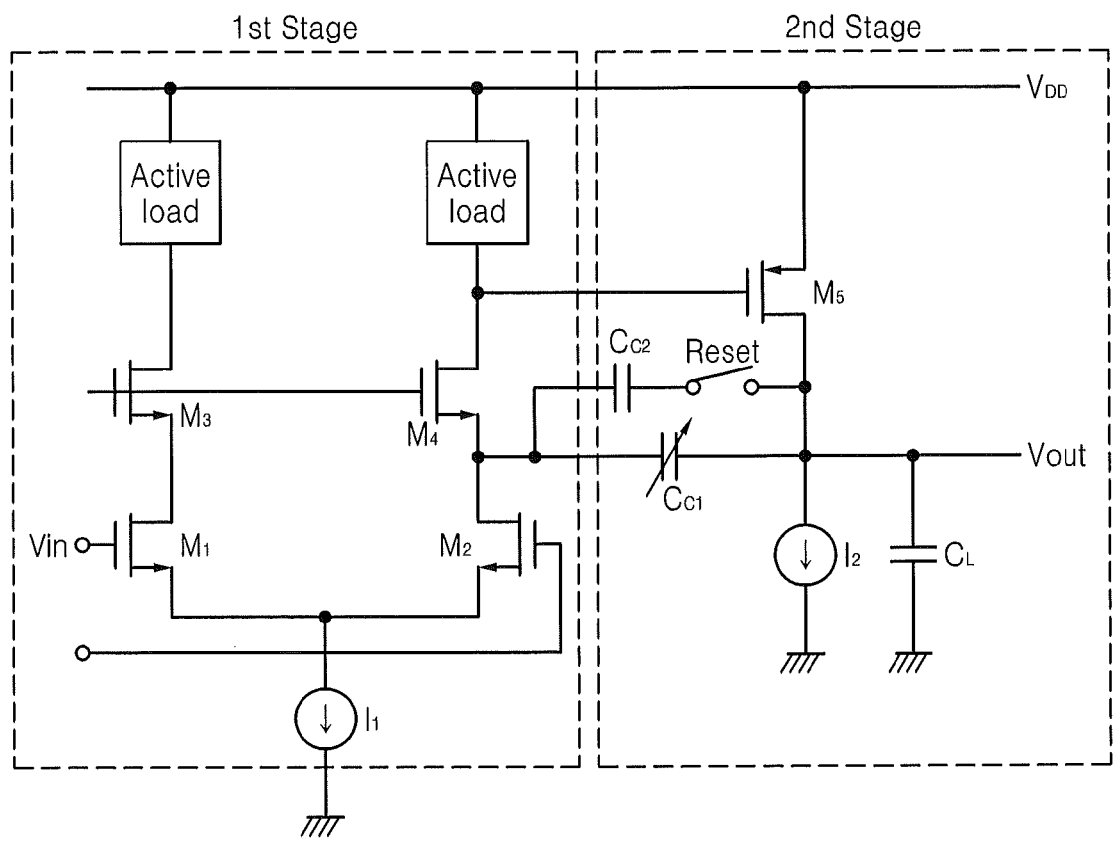
FIG. 6B is a circuit diagram of another implementation of the operational amplifier circuit illustrated in FIG. 5 according to further embodiments.

FIGS. 6A and 6B illustrate first and second implementations of operational amplifier 1a of FIG. 5. The operational amplifier circuits 1a' and 1a" illustrated in FIGS. 6A and 6B may include an active load, first through fifth transistors $M_1$ through $M_5$, and the variable compensation capacitor $C_C$. The active load may operate as a current mirror. The variable compensation capacitor $C_C$ is connected between a source of the cascode component and an output node Vout.

In the two-stage operational amplifier circuits 1a' and 1a", the first stage is a differential stage that includes the first through fourth transistors $M_1$ through $M_4$ which have a gate, a source, and a drain. The gates of the respectively third and fourth transistors $M_3$ and $M_4$ have a common input while the first and second transistors $M_1$ and $M_2$ have different inputs, respectively. A current source is connected in common to the drains of the first and second transistors $M_1$ and $M_2$. Active loads are respectively connected to of the third and fourth transistors $M_3$ and $M_4$, to provide current mirroring.

The variable compensation capacitor $C_C$ is coupled between the input and output of the second stage. The variable compensation capacitor $C_C$ may increase the stability of the operational amplifier circuit 1 by varying with the feedback gain β of the operational amplifier circuit 1a.

In the integrator circuit 50 including the operational amplifier circuit 1a" illustrated in FIG. 6B, a reset period is provided to discharge the capacitors $C_1$ through $C_3$, at which the feedback gain β is 1. At this time, the gap between the poles is increased by increasing the capacitance value of a variable compensation capacitance including capacitors $C_{C1}$ and $C_{C2}$ so that the stability of the operational amplifier circuit 1a" is increased.

The operational amplifier circuit 1a" may include a first variable compensation capacitor $C_{C1}$ and a second compensation capacitor $C_{C2}$, and a reset switch coupled in series with the second compensation capacitor $C_2$ and operating in response to a reset signal Reset. When the reset switching component Reset is closed, the compensation capacitor $C_{C2}$ and the variable compensation capacitor $C_{C1}$ are connected in parallel, providing increased capacitance that can stabilize the output of the operational amplifier circuit 1. The integrator circuit 50 illustrated in FIG. 4 also includes the switching components that operate in response to the reset signal Reset.

In a first operation period of the integrator circuit 50, the feedback gain β is less than 1. In the first operation period, the reset switching component Reset is turned off. This may increase stability, but decrease bandwidth. By reducing the capacitance value of the variable compensation capacitor $C_C$, the gap between the poles is decreased, and therefore, the gain crossover frequency is increased. As a result, the frequency range of a signal output from the operational amplifier circuit 1 is increased.

The operational amplifier circuits 1a and 1b illustrated in FIGS. 6A and 6B are just examples of an operational amplifier having two stages. Embodiments of the inventive subject matter are not restricted to these examples. Embodiments of the inventive subject matter may include any of a number of different types of operational amplifiers that include the variable compensation capacitor $C_C$ between the input and the output of the second stage to be associated with the feedback gain β.

Figure 7:
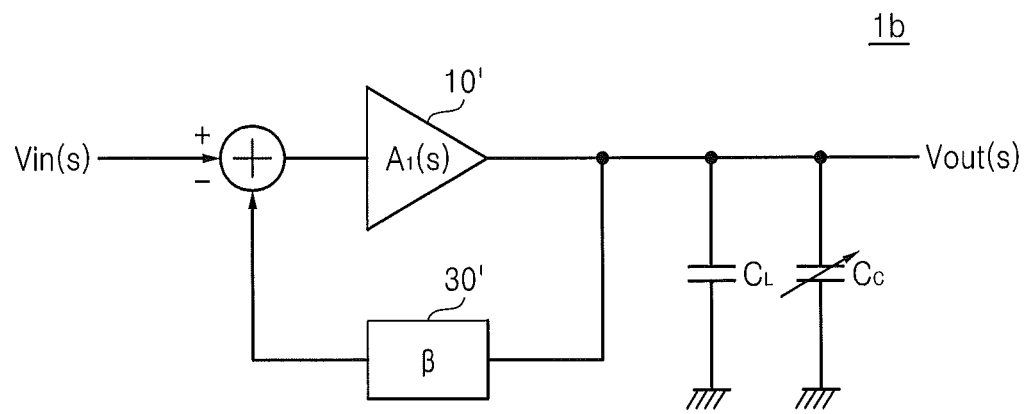
FIG. 7 is a schematic diagram conceptually illustrating an operational amplifier circuit according to additional embodiments of the inventive subject matter.

FIG. 7 is a conceptual diagram of an operational amplifier circuit according to further embodiments of the inventive subject matter. The operational amplifier circuit 1b shown in FIG. 7 is a folded-cascode operational amplifier circuit 1b. The folded-cascode operational amplifier circuit 1b includes a cascode amplifier 10' that includes an operational amplifier and a common gate amplifier. The folded-cascode operational amplifier circuit 1b may also include a load capacitor $C_L$ and a feedback circuit 30'. The folded-cascode operational amplifier circuit 1b may also include a variable compensation capacitor $C_C$ connected in parallel with the load capacitor $C_L$.

As the capacitance of the load capacitor $C_L$ increases the PM increases. The variable compensation capacitor $C_C$ varies with the feedback gain β, so that the folded-cascode operational amplifier circuit 1b may stably operate. The folded-cascode operational amplifier circuit 1b adjusts the capacitance of the variable compensation capacitor $C_C$ using the feedback gain β, thereby maintaining desirable bandwidth.

Although the two-stage operational amplifier circuits 1a and 1b and the folded-cascode operational amplifier circuit 1b are illustrated in FIGS. 6A and 6B and FIG. 7, embodiments of the inventive subject matter are not restricted thereto. The variable compensation capacitor $C_C$ may be used in telescopic, folded and cascode operational amplifiers.

Figure 8:
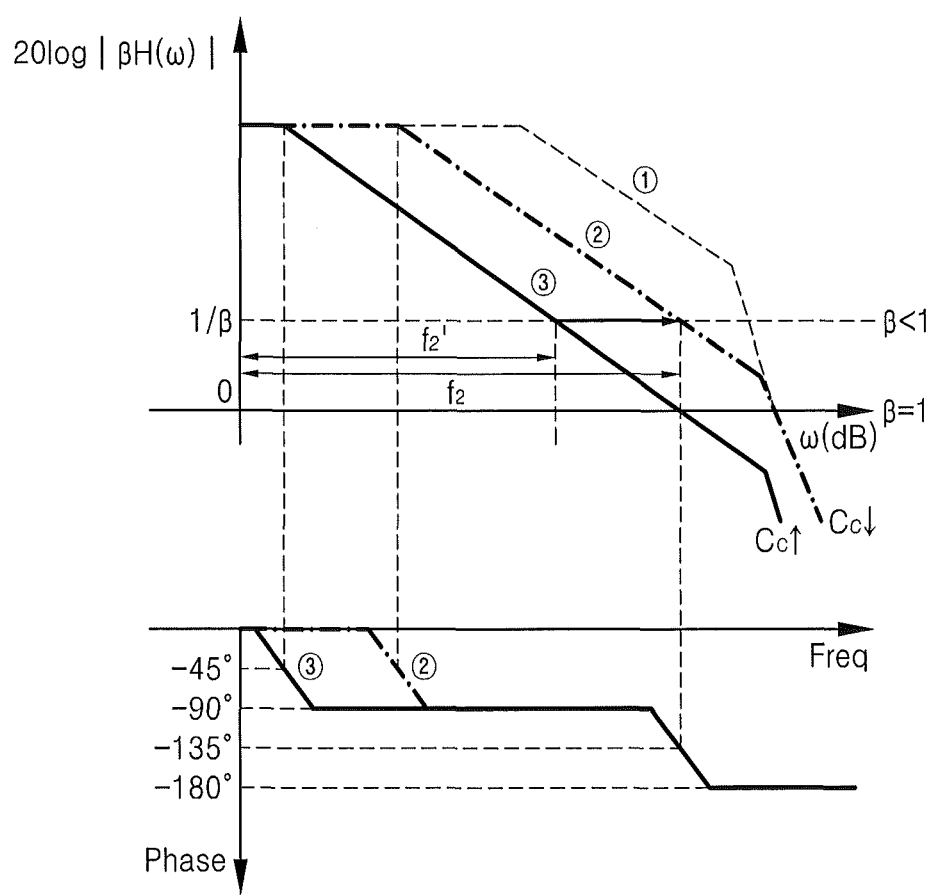
FIG. 8 is a Bode plot of a frequency response of an operational amplifier circuit according to some embodiments of the inventive subject matter.

FIG. 8 is a Bode plot of a frequency response of the operational amplifier circuit 1 of FIG. 4 according to some embodiments of the inventive subject matter. The magnitude and the phase of the product of the transfer function and the feedback gain β of a negative feedback operational amplifier are represented in the Bode plot shown in FIG. 8. It is desirable that a frequency characteristic of the operational amplifier be greater than −180° at a frequency at which the magnitude of the frequency characteristic of the operational amplifier is 1/β in order to enable the operational amplifier circuit 1 to operate stably.

There is no compensation for frequency response in case 1. In case 1, the phase is less than −180° at frequency having a magnitude of 1/β regardless of the value of β. Accordingly, in case 1, in which there is no compensation for the frequency response, the operational amplifier circuit 1 is unstable.

There occurs compensation for the frequency response in case 3. In case 3, the PM is 45° when β is 1 and is 90° when β is less than 1. When the PM is 90° at β less than 1, the circuit becomes more stable, but the bandwidth is decreased, slowing down the operation speed.

Case 2 represents a case in which a frequency response of the operational amplifier circuit 1 has been improved in terms of both stability and bandwidth. In detail, when β is less than 1, the stability of the circuit increases. However, when only the value of β is made less than 1 in case 3 where β is 1, a signal output from the operational amplifier circuit 1 has a frequency of $f_2'$. If a variable compensation capacitor $C_C$ is used, the poles that the transfer function may be split further, so that the operational amplifier circuit 1 has the bandwidth given in case 3 where β is 1, and the feedback gain β less than 1. As a result, the operational amplifier circuit 1 operates stably. However, in case 2, β must be less than 1.

In the operational amplifier circuit 1 with a negative feedback circuit, the feedback gain β and the magnitude of a compensation capacitor are two factors that determine the stability and the bandwidth of the operational amplifier circuit 1. When the feedback gain β is preset to 1 or less, the stable operational amplifier circuit 1 that outputs a signal with a wide bandwidth is realized by adjusting the capacitance of the variable compensation capacitor $C_C$.

Figure 9:
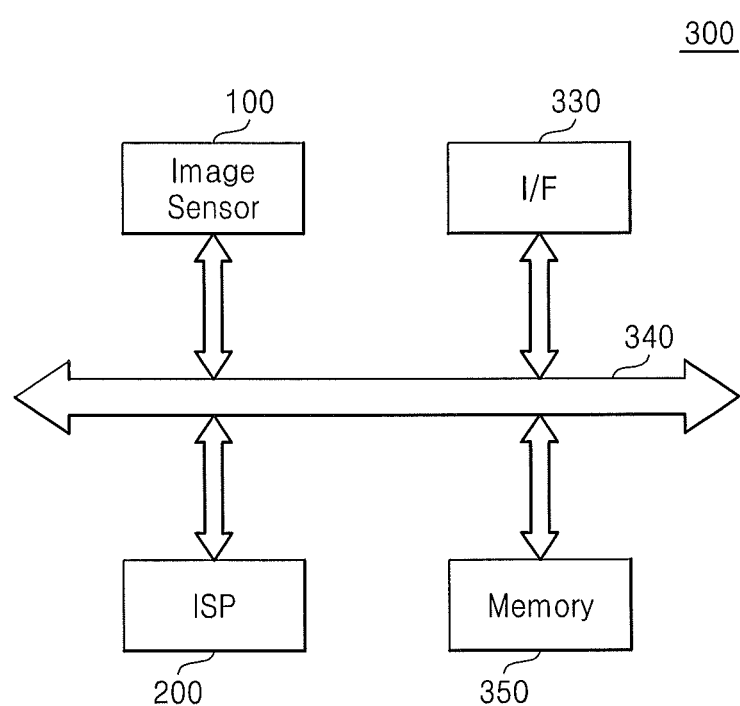
FIG. 9 is a schematic of an electronic device according to some embodiments of the inventive subject matter.

FIG. 9 is a schematic diagram of an electronic device according to some embodiments of the inventive subject matter. The electronic device 300 illustrated in FIG. 9 may be a digital camera, a mobile phone equipped with the digital camera or any electronic device equipped with the digital camera.

The electronic device 300 may process two-dimensional image signal or three-dimensional image signal. The electronic device 300 includes the image sensor circuit 100 according to some embodiments of the inventive subject matter. The electronic device 300 may further include a image signal processor circuit 320 controlling operations of the image sensor circuit 100.

The electronic device 300 may further include an interface 330.

The interface 330 may be an image display device. Or, the interface 330 may be an input/output device.

Accordingly, the electronic device 300 may further include a memory device 350 for storing still image or video image captured by the depth sensor circuit according to control of the image signal processor circuit 200. The memory device 350 may be implemented as a non-volatile memory device.

The non-volatile memory device includes a plurality of non-volatile memory cells.

Each of the non-volatile memory cells may be implemented as Electrically Erasable Programmable Read-Only Memory (EEPROM), flash memory, Magnetic RAM (MRAM), Spin-Transfer Torque MRAM, Conductive bridging RAM (CBRAM), Phase change RAM (PRAM) also called as Ovonic Unified Memory (OUM), Ferroelectric RAM (FeRAM), Resistive RAM (RRAM or ReRAM), Nanotube RRAM, Polymer RAM (PoRAM), Nano Floating Gate Memory (NFGM), holographic memory, Molecular Electronics Memory, or Insulator Resistance Change Memory.

Figure 10:
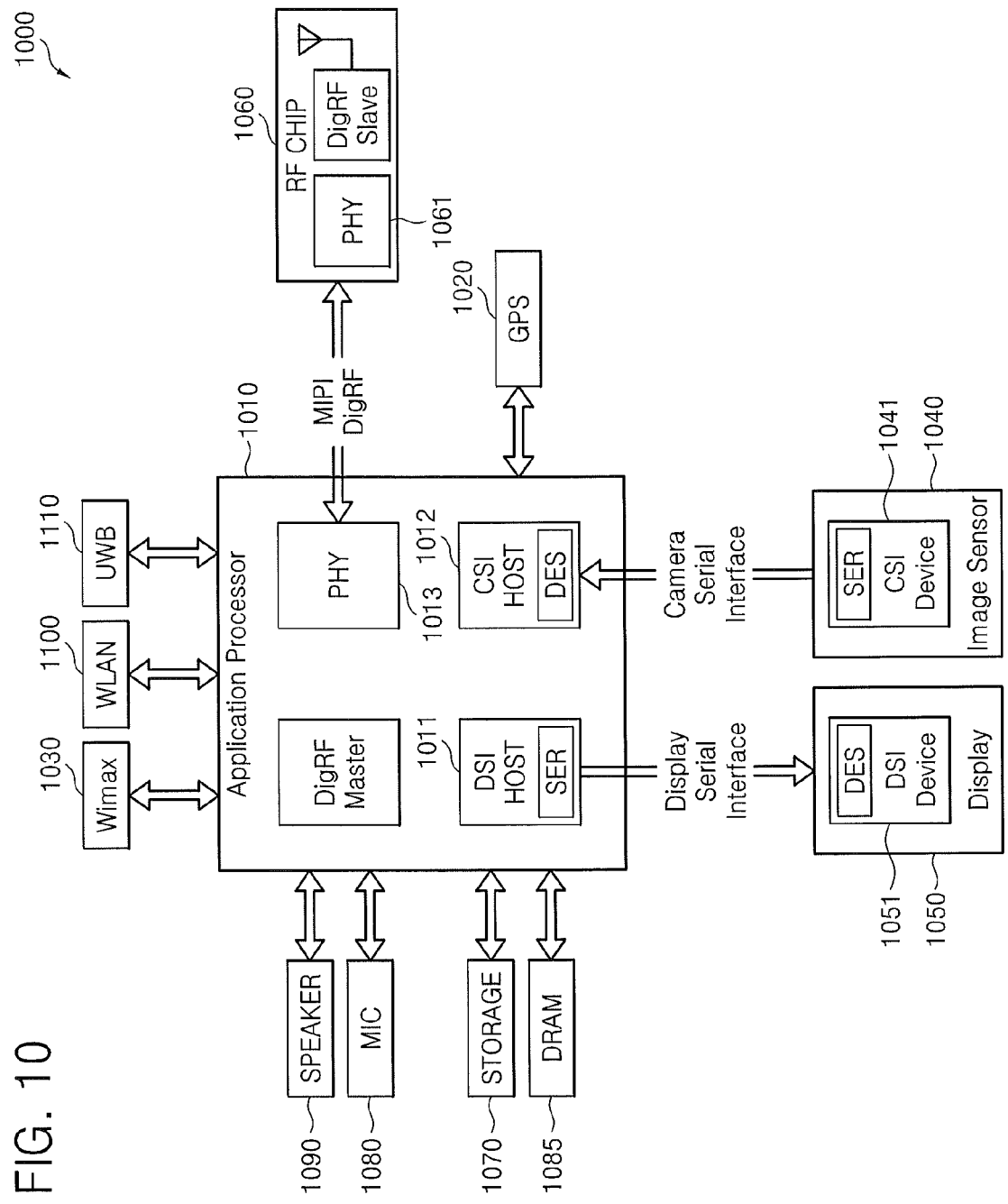
FIG. 10 is a schematic diagram of an electronic system including an image sensor circuit according to some embodiments of the inventive subject matter.

FIG. 10 is a schematic diagram of an electronic system including an image sensor circuit according to some embodiments of the inventive subject matter.

Referring FIG. 10, the electronic system 1000 may be implemented by a data processing apparatus, such as a mobile phone, a personal digital assistant (PDA), a portable media player (PMP), an IP TV, or a smart phone that can use or support the MIPI interface. The electronic system 1000 includes an application processor circuit 1010, an image sensor circuit 1040, and a display 1050.

A Camera Serial Interface (CSI) host 1012 included in the application processor circuit 1010 performs serial communication with a CSI device 1041 included in the image sensor circuit 1040 through CSI. For example, an optical serializer may be implemented in the CSI host 1012, and an optical de-serializer may be implemented in the CSI device 1041.

A Display Serial Interface (DSI) host 1011 included in the application processor circuit 1010 performs serial communication with a DSI device 1051 included in the display 1050 through DSI. For example, an optical serializer may be implemented in the DSI host 1011, and an optical de-serializer may be implemented in the DSI device 1051.

The electronic system 1000 may also include a radio frequency (RF) chip 1060 that communicates with the application processor circuit 1010. A physical layer (PHY) 1013 of the electronic system 1000 and a PHY 1061 of the RF chip 1060 communicate data with each other according to a MIPI DigRF standard. The electronic system 1000 may further include at least one component among a GPS 1020, a storage device 1070, a microphone 1080, a DRAM 1085 and a speaker 1090. The electronic system 1000 may communicate using Wimax 1030, WLAN 1100 or UWB 1110, etc.

Figure 11:
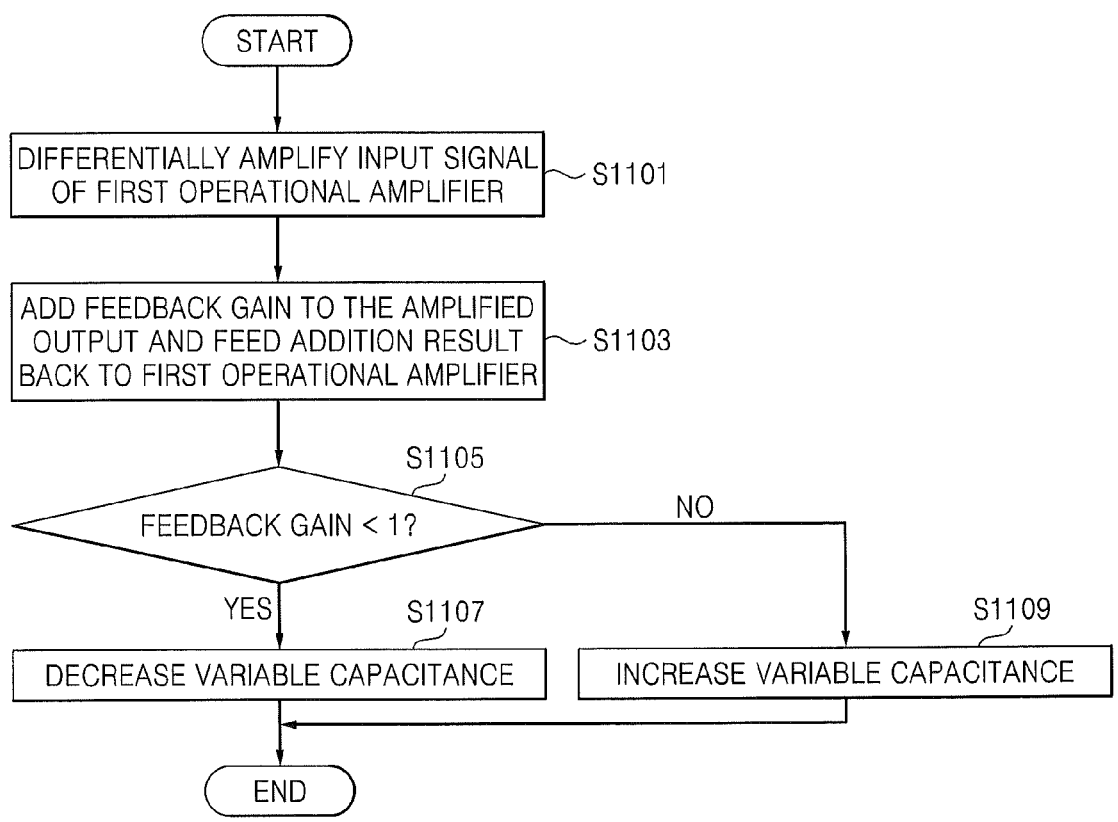
FIG. 11 is a flowchart illustrating operational amplifier frequency response compensation operations according to some embodiments of the inventive subject matter.

FIG. 11 is a flowchart illustrating frequency response compensation operations for an operational amplifier circuit according to some embodiments of the inventive subject matter. Referring to FIGS. 5 and 11, the first operational amplifier 10 differentially amplifies the input signal Vin(S) in operation S1101.

The feedback gain β is added to the amplified output of the first operational amplifier 10 and is then fed back to the input terminal of the first operational amplifier 10 in operation S1103.

It is determined whether the feedback gain β is less than 1 in operation S1105. Since the feedback gain β is less than 1 when passive components are used, whether the feedback gain β is 1 or less than 1 is determined.

When the feedback gain β is 1, the operational amplifier circuit is most unstable. Accordingly, the variable capacitance of the variable compensation capacitor $C_C$ is increased to secure the stability in operation S1109. When the feedback gain β is less than 1, the variable capacitance of the variable compensation capacitor $C_C$ is decreased in operation S1107. As the feedback gain β decreases, the circuit becomes stable. Additionally, the frequency of a signal output from the circuit is increased by decreasing the variable capacitance.

This inventive subject matter may also be implemented as computer-readable code in computer-readable recording medium. Computer-readable recording medium includes any kind of recording device that store data readable by a computer system.

Computer-readable recording medium may be implemented as ROM, RAM, CD-ROM, magnetic tape, floppy disk, or optical data storage device. Also, the program code of this inventive subject matter to perform the method of estimating object information may be transmitted in the form of carrier wave (e.g. transmission over the Internet).

Also, computer-readable recording medium may be distributed in a networked computer system, and computer-readable code may be stored and executed in distributed manner. Functional program, code and code segments to implement this inventive subject matter may be easily deduced by programmers.

As described above, according to some embodiments of the inventive subject matter, the stability of an operational amplifier circuit is secured by adjusting a feedback gain, and the wide bandwidth is realized by adjusting a capacitance.

In other words, the capacitance is adjusted according to the feedback gain, so that the operational amplifier circuit stably outputs a high-frequency signal.

In addition, when the bandwidth is increased, the setting time of a logic component used in an image sensor circuit is decreased. While the inventive subject matter has been particularly shown and described with reference to exemplary embodiments thereof, it will be understood by those of ordinary skill in the art that various changes in forms and details may be made therein without departing from the spirit and scope of the inventive subject matter as defined by the following claims.

What is claimed is:

1. An apparatus comprising:
an operational amplifier circuit comprising at least one operational amplifier;
a feedback circuit coupled between an output terminal and an input terminal of the operational amplifier circuit and configured to apply a feedback gain to an output signal at the output terminal of the operational amplifier circuit; and
a variable compensation capacitor coupled to the output terminal of the operational amplifier circuit and configured to vary a capacitance thereof responsive to the feedback gain, wherein the capacitance of the variable compensation capacitor decreases to increase stability and decrease bandwidth in an operation period in which the feedback gain is less than 1 and wherein the capacitance of the variable compensation capacitor increases in a reset period in which the feedback gain is 1.

2. The apparatus of claim 1, wherein the variable compensation capacitor is coupled in parallel with a load capacitance at the output terminal of the operational amplifier circuit.

3. The apparatus of claim 1, wherein the operational amplifier circuit comprises first and second operational amplifiers coupled in cascade, wherein the feedback circuit is coupled between an output terminal of the second operational amplifier and an input terminal of the first operational amplifier, and wherein the variable compensation capacitor is coupled between the output terminal of the second operational amplifier and an input terminal of the second operational amplifier.

4. The apparatus of claim 1, further comprising a series combination of a capacitor and a switch coupled in parallel with the variable compensation capacitor.

5. A correlated double sampling (CDS) integrator circuit comprising the apparatus of claim 1.

6. The integrator circuit of claim 5, further comprising:
a first capacitor configured to be charged with an input signal and to transfer a charge;
a second capacitor connected between the first capacitor and the input terminal of the operational amplifier circuit;
a third capacitor coupled to the output terminal of the operational amplifier circuit; and
a switching circuit coupled to the first, second and third capacitors and configured to charge the first capacitor and the third capacitor with charges corresponding to image and reset samples and to charge the second capacitor with a charge corresponding to an input offset voltage of the operational amplifier circuit such that a signal at the output terminal of the operational amplifier circuit represents a difference between the image and reset samples.

7. The integrator circuit of claim 6, wherein the switching circuit comprises a switch configured to short the third capacitor responsive to a reset signal and wherein the variable compensation capacitor increases in capacitance when the reset signal is active.

8. An image sensor circuit comprising:
an analog processor circuit comprising the integrator circuit of claim 5 and configured to sample and amplify an input analog signal; and
an analog-to-digital converter circuit configured to convert an analog signal output from the analog processor circuit into a digital signal.

9. An electronic device comprising the image sensor circuit of claim 8.

10. An electronic system comprising the image sensor circuit of claim 8.

11. An apparatus comprising:
a differential amplifier circuit;
a common-gate amplifier circuit coupled to an output terminal of the differential amplifier circuit;
a feedback circuit coupled between an output terminal of the common-gate amplifier circuit and an input terminal of the differential amplifier circuit and configured to apply a feedback gain to an output signal at the output terminal of the common-gate amplifier circuit; and
a variable compensation capacitor coupled to the output terminal of the common gate amplifier circuit and configured to vary a capacitance thereof responsive to the feedback gain, wherein the capacitance of the variable compensation capacitor decreases responsive to the feedback gain decreasing below 1 in an operation period to increase stability and decrease bandwidth and wherein the capacitance of the variable compensation capacitor increases responsive to the feedback gain increasing to 1 in a reset period.

12. The apparatus of claim 11, wherein the variable compensation capacitor is coupled between the output terminal of the differential amplifier circuit and the output terminal of the common-gate amplifier circuit.

13. The apparatus of claim 11, wherein the variable compensation capacitor is coupled in parallel with a load capacitance at the output of the common-gate amplifier circuit.

14. The apparatus of claim 11, further comprising a series combination of another capacitor and a switch coupled in parallel with the variable compensation capacitance.

15. An image sensor comprising an analog signal processor circuit configured to receive signals from a pixel array and comprising the apparatus of claim 11.

* * * * *